United States Patent
Grodzki et al.

(10) Patent No.: US 9,726,740 B2
(45) Date of Patent: Aug. 8, 2017

(54) MAGNETIC RESONANCE APPARATUS AND METHOD FOR OPERATION THEREOF WITH AN ACCELERATED PROGRESSION OF A REPEATING PULSE SEQUENCE WITH AN OPTIMIZED GRADIENT CURVE

(71) Applicant: Siemens Aktiengesellschaft, Munich (DE)

(72) Inventors: David Grodzki, Erlangen (DE); Bjoern Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 624 days.

(21) Appl. No.: 14/321,836

(22) Filed: Jul. 2, 2014

(65) Prior Publication Data
US 2015/0008919 A1    Jan. 8, 2015

(30) Foreign Application Priority Data
Jul. 5, 2013    (DE) ........................ 10 2013 213 255

(51) Int. Cl.
G01V 3/00       (2006.01)
G01R 33/54      (2006.01)
G01R 33/565     (2006.01)

(52) U.S. Cl.
CPC ......... *G01R 33/543* (2013.01); *G01R 33/546* (2013.01); *G01R 33/56518* (2013.01)

(58) Field of Classification Search
CPC .................................................. G01R 33/543
USPC ................................................. 324/322, 318
See application file for complete search history.

(56) References Cited

U.S. PATENT DOCUMENTS

| | | | |
|---|---|---|---|
| 6,198,282 B1* | 3/2001 | Dumoulin | G01R 33/3852 324/307 |
| 6,687,527 B1 | 2/2004 | Wu et al. | |
| 2005/0077895 A1* | 4/2005 | Hargreaves | G01R 33/561 324/307 |
| 2011/0113376 A1 | 5/2011 | Suzuki et al. | |
| 2011/0118587 A1* | 5/2011 | Roemer | G01R 33/022 600/411 |

(Continued)

OTHER PUBLICATIONS

Jochimsen, "Short Tutorial for ODIN, the Object-oriented Development Interface for NMR," Dec. 18, 2012.

(Continued)

*Primary Examiner* — Louis Arana
(74) *Attorney, Agent, or Firm* — Schiff Hardin LLP

(57) ABSTRACT

In a method for an accelerated progression of a repeating pulse sequence with an optimized gradient curve (that has at least one pulse) for a magnetic resonance examination by operation of a magnetic resonance apparatus, boundary conditions for a first gradient pulse of a first progression of the pulse sequence are detected, and the boundary conditions of the first gradient pulse of the first progression of the pulse sequence are compared with boundary conditions of a previous gradient pulse of a previous progression of the pulse sequence. An optimized gradient curve of the first gradient pulse of the first progression of the pulse sequence is determined from the gradient curve of the previous gradient pulse when agreement of the boundary conditions of the first gradient pulse with the boundary conditions of the previous gradient pulse exists.

10 Claims, 1 Drawing Sheet

(56) References Cited

U.S. PATENT DOCUMENTS

2015/0212179 A1* 7/2015 Overall ............... G01R 33/543
 324/309
2015/0293197 A1* 10/2015 Taniguchi ........... G01R 33/543
 324/309

OTHER PUBLICATIONS

"ODIN—Object-oriented development interface for NMR," Jochimsen et al., Journal of Magnetic Resonance (2004).

* cited by examiner

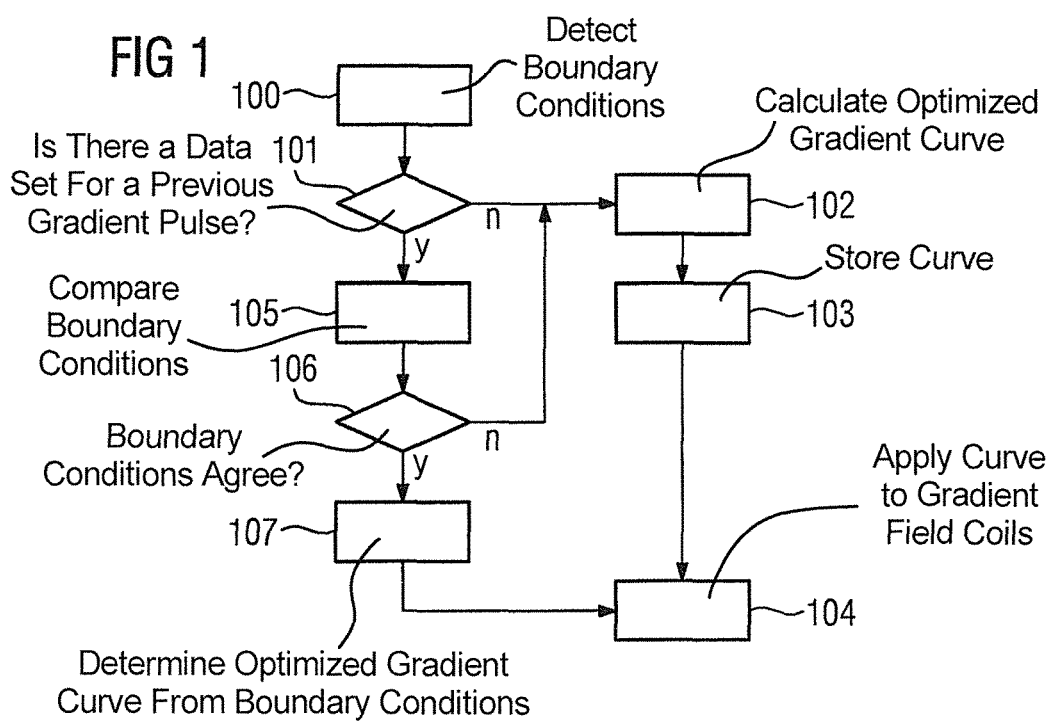
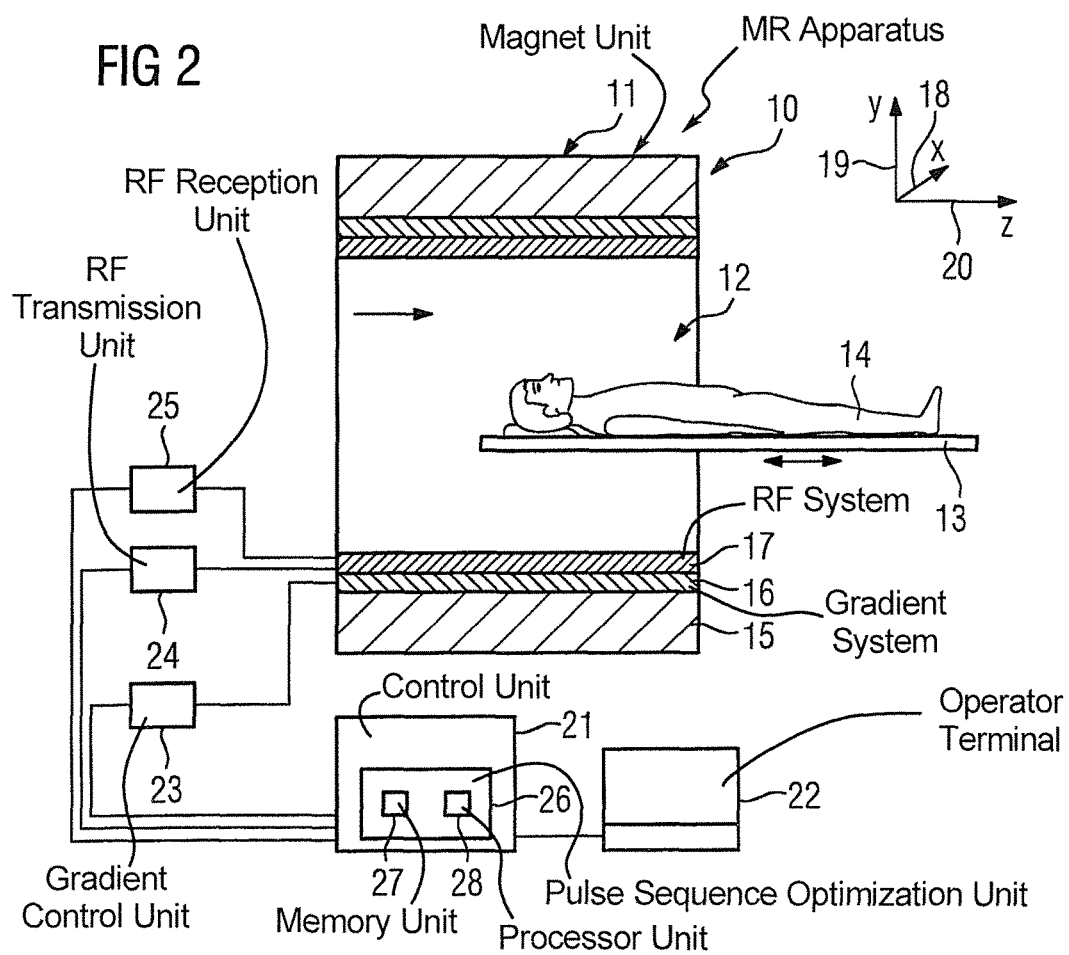

MAGNETIC RESONANCE APPARATUS AND METHOD FOR OPERATION THEREOF WITH AN ACCELERATED PROGRESSION OF A REPEATING PULSE SEQUENCE WITH AN OPTIMIZED GRADIENT CURVE

BACKGROUND OF THE INVENTION

Field of the Invention

The present invention relates to a method for operating a magnetic resonance apparatus in order to implement an accelerated progression of a repeating pulse sequence with an optimized gradient curve. The invention also concerns a magnetic resonance apparatus operated according to such a method.

Description of the Prior Art

For a magnetic resonance examination, the body of a patient is typically exposed to a high basic magnetic field produced by a basic magnetic field system of a magnetic resonance apparatus. For the magnetic resonance examination, a magnetic field gradient is additionally applied by a gradient system of the magnetic resonance apparatus. The magnetic resonance apparatus has a radio-frequency transmission system for an emission of excitation signals (radio-frequency pulses). By means of the excitation signals (radio-frequency pulses), nuclear spins of atoms excited to resonance are deflected (flipped) by a defined flip angle relative to the magnetic field lines of the basic magnetic field. Upon a subsequent relaxation of the nuclear spins, radio-frequency signals (known as magnetic resonance signals) are radiated that are received by suitable reception antennas. The desired image data are subsequently reconstructed from the acquired magnetic resonance signals.

For a magnetic resonance measurement, a magnetic resonance sequence is emitted that is composed of a chronological series of radio-frequency (RF) pulses and gradient pulses emitted in coordination with the RF pulses, such as for slice selection and readout. The gradient pulses of the pulse sequence are defined by their gradient amplitude, gradient pulse duration and an edge steepness, or by the first derivative dG/dt of a pulse shape of the gradient pulses (also typically designated as a "slew rate"). An additional important gradient pulse value is the gradient pulse moment, which is defined as the integral of the gradient amplitude over time. It is a problem that the generation of eddy currents in conductive components of the apparatus increases with increasing gradient amplitudes and/or slew rates, and these eddy currents contribute to the generation of Lorentz forces that acoustic noise exposure also increases.

In order to minimize noise exposure, the gradient pulses are optimized with regard to their gradient curve. An optimized gradient curve is calculated for every single gradient pulse, which is very time-consuming.

SUMMARY OF THE INVENTION

An object of the present invention is to provide a method for an accelerated progression of a repeating pulse sequence in which a gradient curve for individual gradient pulses can be determined particularly quickly.

The method according to the invention for an accelerated progression of a repeating pulse sequence with an optimized gradient curve (that has at least one gradient pulse) for a magnetic resonance examination by a magnetic resonance apparatus includes the following steps:

detection of boundary conditions for a first gradient pulse of a first progression of the pulse sequence, comparison of the boundary conditions of the first gradient pulse of the first progression of the pulse sequence with boundary conditions of a previous gradient pulse of a previous progression of the pulse sequence, and determination of an optimized gradient curve of the first gradient pulse of the first progression of the pulse sequence, wherein the determination of the gradient curve of the first gradient pulse takes place depending on an agreement of the boundary conditions of the first gradient pulse with the boundary conditions of the previous gradient pulse.

The periodicity of the pulse sequence can be utilized to determine and/or optimize a gradient curve of a gradient pulse particularly quickly and with a time savings. In particular, given the same boundary conditions, essentially the same gradient curves can be assumed for successive gradient pulses, such that a recalculation of the gradient curve can be foregone given the same boundary conditions. Especially in the readout direction and/or in a slice selection direction, the same gradient curve is often required given the same boundary conditions for the individual repetitions. Furthermore, the computing power and/or processing time for a complicated calculation and/or determination of the gradient curve can be reduced. The term "optimized gradient curve" as used herein means a gradient curve that includes an optimally smooth curve, for example even a rounded gradient curve, such that a reduction of the slew rate that is used and/or a lower noise development can be achieved by the optimized gradient curve for the gradient pulse.

Given an agreement of the boundary conditions of the first gradient pulse with the boundary conditions of the additional gradient pulse, the optimized gradient curve of the optimized gradient pulse is developed from the already-optimized gradient curve of the previous gradient pulse. Calculation time and/or computing capacity for the determination of the optimized gradient curve of the first gradient pulse thus can be reduced. Due to the time savings for the calculation of the optimized gradient curve, additional features can advantageously be implemented in real time. Furthermore, a less powerful (and therefore more cost-effective) computer can be used due to the reduction of the necessary computing capacity of a computer. The optimized gradient curve for the additional gradient pulse can be calculated and/or determined by means of a spline interpolation. In addition to this, further methods for optimization of the gradient curve of the previous gradient pulse that appear reasonable to those skilled in the art are suitable. As used herein an "agreement of boundary conditions" means an exact agreement of multiple boundary conditions, with each boundary condition for the first gradient pulse exactly agreeing with the corresponding boundary condition of the additional gradient pulse.

The boundary conditions of the first gradient pulse and/or of the second gradient pulse can include at least the duration of the gradient pulse and/or the gradient moment and/or a start point in time and/or an end point in time of the gradient pulse. A gradient curve of a gradient pulse can therefore be established particularly exactly, and with this an effective optimization of the gradient curve can also be achieved. The boundary conditions for a respective gradient pulse preferably include all four boundary conditions in order to achieve a complete establishment of the gradient pulse, and therefore of the gradient curve.

In an embodiment of the invention, the optimized gradient curve of the previous gradient pulse is stored in a memory unit of the magnetic resonance apparatus. A particularly fast access to the optimized gradient curve of the previous gradient pulse thus can be made, such that a particularly fast determination of the optimized gradient curve for the first gradient pulse can be supported.

Also, the boundary conditions of the previous gradient pulse for the previous progression of the pulse sequence can be stored in the memory unit together with the optimized gradient curve of the previous gradient pulse. The (in particular four) boundary conditions are advantageously saved and/or stored together with the optimized gradient curve for a respective previous gradient pulse within data arrays of the memory unit, such that a simple and fast access is provided both to the boundary conditions and to the optimized gradient curve for the determination of the optimized gradient curve of the first gradient pulse during a sequence progression.

In a further embodiment of the invention, the optimized gradient curve of the first gradient pulse is calculated independently of the optimized gradient curve of the previous gradient pulse given a dissimilarity between the boundary conditions of the first gradient pulse and the boundary conditions of the second gradient pulse. An optimized gradient curve can therefore also be provided given a disagreement of the boundary conditions with a previous gradient echo pulse for additional repetitions of the pulse sequence. A data set that is provided for the comparison with a first gradient pulse can also be additionally expanded. In this context dissimilarity means that at least one boundary condition of the first gradient pulse is different relative to at least one boundary condition of the boundary conditions of the previous gradient pulse.

Moreover, the calculated optimized gradient curve of the additional gradient pulse can be stored together with the boundary conditions of the previous gradient pulse. For gradient pulses in the further progression of the pulse sequence, the optimized gradient curve can be provided for a comparison of the boundary conditions with these gradient pulses, and therefore a probability of an agreement can be increased.

The optimized gradient curve of the first gradient pulse is preferably calculated using a spline interpolation. The spline interpolation technique has the advantage that curve paths with defined approximation properties are achieved with low computing cost. Also, a spline interpolation can be calculated with low linear cost. A fourth-order interpolation is preferably used. Provided node points—for example fixed points—are interpolated by a spline interpolation with the use of polynomials (known as splines) that are continuous in segments. Alternatively or additionally, further calculation methods and/or interpolation methods that appear reasonable to those skilled in the art are also conceivable for calculation of the optimized gradient curve.

The invention also encompasses a magnetic resonance apparatus that has a magnet unit that produces a basic field magnet, a gradient system and a radio-frequency system, and a pulse sequence optimization unit that is designed to execute the method according to the invention for an accelerated progression of a repeating pulse sequence with an optimized gradient curve. The periodicity of the pulse sequence can therefore be utilized particularly quickly and with a time savings to determine and/or optimize a gradient curve of a gradient pulse. Calculation time and/or computing power for the determination of the optimized gradient curve of the first gradient pulse can be reduced. Features can be implemented in real time due to the time savings for the calculation of the optimized gradient curve. Furthermore, less powerful (and therefore more cost-effective) computers can be used due to the reduced necessary computing power of a computer that forms or includes a pulse sequence optimization unit.

The invention also encompasses a non-transitory computer-readable data storage medium that can be loaded directly into a memory unit of a pulse sequence optimization unit, encoded with program code segments in order to execute all steps of a method for an accelerated progression of a repeating pulse sequence with an optimized gradient curve when the program code is executed in the pulse sequence optimization unit. Such a realization in software has the advantage that existing control units of magnetic resonance apparatuses may be suitably modified by implementation of a computer program in order to optimize pulse sequences in the manner according to the invention.

BRIEF DESCRIPTION OF THE DRAWINGS

FIG. 1 is a flowchart of an embodiment of the method according to the invention for an accelerated progression of a repeated pulse sequence.

FIG. 2 schematically illustrates a magnetic resonance apparatus that implements the method shown in FIG. 1.

DESCRIPTION OF THE PREFERRED EMBODIMENTS

A magnetic resonance apparatus 10 according to the invention is schematically shown in FIG. 2. The magnetic resonance apparatus 10 has a magnet unit 11 with a patient examination region 12 cylindrically surrounded by the magnet unit 11. An examination subject (in particular a patient) 14 can be introduced into the patient examination region 12 by a patient support device 13 of the magnetic resonance apparatus 10. The patient support device 13 can be designed so as to be movable relative to the magnet unit 11 within the patient examination region 12.

Significant components of the magnet unit 11 are a basic field magnet 15, a gradient system 16 and a radio-frequency system 17. The gradient system 16 includes magnetic field gradient coils to generate magnetic field gradients in the x-direction 18, in the y-direction 19 and in the z-direction 20. The individual magnetic field gradient coils in the x-direction 18, y-direction 19 and z-direction 20 can be controlled independently of one another so that a gradient field can be applied in arbitrary spatial directions (for example in the slice selection direction, in the phase coding direction or in the readout direction). These directions depend on a selected slice orientation. In the exemplary embodiment, the radio-frequency system 17 is a whole-body radio-frequency coil that emits radio-frequency signals. The reception of magnetic resonance signals induced in the examination subject can take place via the whole-body radio-frequency coil.

The individual components of the magnet unit 11 are controlled by a system control unit 21. For this purpose, the system control unit 21 includes at least one computer. The system control unit 21 is connected via a terminal interface with an operator terminal 22 via which an operator can control the entire magnetic resonance apparatus 10. In the present case, as a computer this operator terminal 22 is equipped with keyboard, one or more monitors, and additional input devices, such that a graphical user interface is provided to the operator.

A gradient control unit 23 of the magnetic resonance apparatus 10 is controlled by the system control unit 21. From this gradient control unit 23, the individual magnetic field gradient coils are fed with control signals according to a gradient pulse sequence. Gradient pulses are activated at precisely set time positions and with a precisely set time curve during a magnetic resonance measurement.

Moreover, a radio-frequency transmission unit 24 of the magnetic resonance apparatus 10 is controlled by the system control unit 21 in order to feed radio-frequency pulses into the whole-body radio-frequency coil according to a predetermined radio-frequency pulse sequence. In addition, the magnetic resonance apparatus 10 has a radio-frequency reception unit 25 that is designed to read out and further process the magnetic resonance signals received by the whole-body radio-frequency coil.

Furthermore, the system control unit 21 includes a reconstruction unit (not shown in detail) that reconstructs image data from the magnetic resonance signals.

A pulse sequence or, respectively, a magnetic resonance sequence is initially selected for a measurement (data acquisition) of the magnetic resonance apparatus. The selection can take place automatically and/or independently via the system control unit 21. Additionally, individual parameters that are important for the selection of the pulse sequence can be selected and/or entered by an operator via the operator terminal 22.

The system control unit 21 furthermore has a pulse sequence optimization unit 26 that is designed for optimization of the gradient pulses during a progression of a pulse sequence.

For this purpose, the pulse sequence optimization unit has a memory unit 27 in which are stored software and/or computer programs that are required for the optimization of the gradient pulses. In addition, the pulse sequence optimization unit 26 has a processor unit 28 that executes the software and/or computer programs stored in the memory unit 27 are executed during a progression of the selected pulse sequence.

A method according to the invention for an accelerated progression of a repeating pulse sequence with an optimized gradient curve is shown in FIG. 1. The magnetic resonance examination of the patient 14 is initially started with the selected pulse sequence, and this pulse sequence is executed repeatedly for the magnetic resonance examination. A start signal for the magnetic resonance examination can be input, for example manually by an operator via the operator terminal 22. The execution of the pulse sequence takes place by means of the system control unit 21 together with the gradient control unit 23 and the radio-frequency control unit 24.

For a first progression of the pulse sequence, boundary conditions for a first gradient pulse are initially detected by the pulse sequence optimization unit 26 in a first method step 100. The boundary conditions include duration of the gradient pulse and/or a gradient moment of the gradient pulse and/or a start point in time of the gradient pulse and/or an end point in time of the gradient pulse.

For an accelerated progression of an optimization of the first gradient pulse, a query 101 initially takes place—by means of the pulse sequence optimization unit 26—as to whether a data set of an additional gradient pulse of a previous progression of a gradient pulse is already stored within the memory unit 27. This data set for an additional gradient pulse includes at least one optimized curve of the additional gradient pulse and also the four boundary conditions that have led to this optimized curve of the additional gradient pulse. The optimized curve of the additional gradient pulse is preferably stored, together with the four boundary conditions, within a data array of the memory unit 27.

If the query 101 indicates that no stored data set with an optimized curve of an additional gradient pulse of a previous progression of the pulse sequence is present, for the first gradient pulse, the optimized curve must be calculated by means of the pulse sequence optimization unit 26 using the four boundary conditions. The calculation of the optimized gradient curve of the first gradient pulse takes place in a further method step 102 by means of a spline interpolation that is executed by the pulse sequence optimization unit 26 (in particular the processor unit 28 of the pulse sequence optimization unit 26). The calculated, optimized gradient curve of the first gradient pulse is stored, together with the four boundary conditions, within the data array of the memory unit 27 in a method step 103 that follows this. In addition, in a further method step 104 the calculated optimized gradient curve for the first gradient pulse is applied to the magnetic field gradient coils.

If the query 101 indicates that a stored data set with an optimized curve of an additional gradient pulse of a previous progression of the pulse sequence is already present within the memory unit 27, a comparison of the boundary conditions of the first gradient pulse of the first progression of the pulse sequence with the boundary conditions of the additional gradient pulse of the previous progression of the pulse sequence takes place by means of the pulse sequence optimization unit 26 in a further method step 105. Each boundary condition of the first gradient pulse is hereby separately compared by the pulse sequence optimization unit 26 with the corresponding boundary condition of the additional gradient pulse.

Following this, an optimized gradient curve of the first gradient pulse of the first progression of the pulse sequence is determined by means of the pulse sequence optimization unit 26, wherein the determination of the optimized gradient curve of the first gradient pulse takes place depending on an agreement of the boundary conditions of the first gradient pulse with the boundary conditions of the additional gradient pulse. A query 106 initially takes place as to whether the boundary conditions of the first gradient pulse agree with the boundary conditions of the additional gradient pulse. Insofar as the query 106 yields that an agreement of the boundary conditions of the first gradient pulse with the boundary conditions of the additional gradient pulse exists, in a method step 107 following this the optimized gradient curve of the first gradient pulse of the first progression of the pulse sequence is calculated from the optimized gradient curve of the additional gradient pulse. The optimized gradient curve of the additional gradient pulse is read out from the memory unit 27 by the pulse sequence optimization unit, and this optimized gradient curve is adopted for the first gradient pulse.

Given an agreement of the boundary conditions of the first gradient pulse with the boundary conditions of the additional gradient pulse, each of the boundary conditions (for example the duration of the first gradient pulse or a gradient moment of the first gradient pulse or a start or end point in time of the first gradient pulse) must independently agree exactly with the respective boundary condition (in particular the duration or a gradient moment or a start or end point in time of the additional gradient pulse). Only if all four boundary conditions of the first gradient pulse agree exactly with the four boundary conditions of the additional gradient pulse are the conditions for execution of method step 107 satisfied.

After the method step 107, in the further method step 104 the determined optimized gradient curve for the first gradient pulse is applied to the magnetic field gradient coils.

If the query 106 indicates that dissimilarity exists between the boundary conditions of the first gradient pulse and the boundary conditions of the additional gradient pulse, the method step 102 is executed again by the pulse sequence optimization unit 26 and the optimized gradient curve for the first gradient pulse is calculated. Following this, the calculated optimized gradient curve (together with the boundary conditions) is stored within the data array of the memory unit 27 in the method step 103. Furthermore, in the further method step 104 the determined optimized gradient curve for the first gradient pulse is applied to the magnetic field gradient coils.

The method described with regard to FIG. 1 for an accelerated progression of a repeating pulse sequence with an optimized gradient curve repeats with every progression of the pulse sequence. Only when the magnetic resonance measurement is ended is the method described above for an accelerated progression of a repeating pulse sequence with an optimized gradient curve ended as well.

The software and/or computer programs stored in the memory unit of the pulse sequence optimization unit 26 include a computer program that can be loaded directly into a memory unit of a pulse sequence optimization unit 26, with program code segments in order to execute all steps of a method for an accelerated progression of a repeating pulse sequence with an optimized gradient curve when the program is executed in the processor unit 28 of the pulse sequence optimization unit 26.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus comprising a gradient system, with a repeating pulse sequence in which said gradient system is operated to activate an optimized gradient curve for a magnetic resonance data acquisition, said method comprising:
    detecting boundary conditions for a first gradient pulse of a first repetition of said pulse sequence;
    in a processor, comparing the boundary conditions of the first gradient pulse of the first repetition of the pulse sequence with boundary conditions of a previous gradient pulse activated during a previous repetition of the pulse sequence;
    in said processor, if agreement exists between the boundary conditions of the first gradient pulse and the boundary conditions of the previous gradient pulse, determining an optimized gradient curve for the first gradient pulse of the first repetition of the pulse sequence from an optimized gradient curve of said previous gradient pulse; and
    operating said gradient system of said magnetic resonance apparatus in said first repetition of said pulse sequence by activating said first gradient pulse with said optimized gradient curve.

2. A method as claimed in claim 1 comprising developing the optimized gradient curve of the first gradient pulse from the optimized gradient curve of the previous gradient pulse upon agreement of said boundary conditions of the first gradient pulse with the boundary conditions of the previous gradient pulse.

3. A method as claimed in claim 1 comprising using at least one boundary condition of said first gradient pulse and said previous gradient pulse selected from the group consisting of a duration of the respective gradient pulse, a gradient moment of the respective gradient pulse, a starting point in time of the respective gradient pulse, and an end point in time of the respective gradient pulse.

4. A method as claimed in claim 1 comprising storing the optimized gradient curve of the previous gradient pulse in a memory that is accessible by said processor when determining said optimized gradient curve of said first gradient pulse in said first repetition of said pulse sequence.

5. A method as claimed in claim 4 comprising storing the boundary conditions of the pervious gradient pulse in said memory together with said optimized gradient curve of the previous gradient pulse.

6. A method as claimed in claim 1 comprising calculating the optimized gradient curve of the first gradient pulse independently of the optimized gradient curve of the previous gradient pulse if the comparison of the boundary conditions of the first gradient pulse and the boundary condition of the previous gradient pulse shows a dissimilarity between the boundary conditions of the first gradient pulse and the boundary conditions of the previous gradient pulse.

7. A method as claimed in claim 6 comprising storing the optimized gradient curve of the first gradient pulse together with the boundary conditions of the first gradient pulse in a memory.

8. A method as claimed in claim 6 comprising calculating the optimized gradient curve of the first gradient pulse by a spline interpolation.

9. A magnetic resonance apparatus comprising:
    a magnetic resonance data acquisition unit comprising a gradient system;
    a processor configured to detect boundary conditions for a first gradient pulse of a first repetition of said pulse sequence;
    said processor being configured to compare the boundary conditions of the first gradient pulse of the first repetition of the pulse sequence with boundary conditions of a previous gradient pulse activated during a previous repetition of the pulse sequence;
    said processor being configured, if agreement exists between the boundary conditions of the first gradient pulse and the boundary conditions of the previous gradient pulse, to determine an optimized gradient curve for the first gradient pulse of the first repetition of the pulse sequence from an optimized gradient curve of said previous gradient pulse; and
    said processing being configured to operate said gradient system of said magnetic resonance apparatus in said first repetition of said pulse sequence by activating said first gradient pulse with said optimized gradient curve.

10. A non-transitory, computer-readable data storage medium encoded with programming instructions, said storage medium being loaded into a control and processing system of a magnetic resonance apparatus, that also comprises a gradient system, said programming instructions causing said computerized control and processing system to:
    detect boundary conditions for a first gradient pulse of a first repetition of said pulse sequence;
    compare the boundary conditions of the first gradient pulse of the first repetition of the pulse sequence with boundary conditions of a previous gradient pulse activated during a previous repetition of the pulse sequence;

if agreement exists between the boundary conditions of the first gradient pulse and the boundary conditions of the previous gradient pulse, determine an optimized gradient curve for the first gradient pulse of the first repetition of the pulse sequence from an optimized gradient curve of said previous gradient pulse; and operate said gradient system of said magnetic resonance apparatus in said first repetition of said pulse sequence by activating said first gradient pulse with said optimized gradient curve.

* * * * *